(12) United States Patent
Lin et al.

(10) Patent No.: US 10,037,954 B2
(45) Date of Patent: Jul. 31, 2018

(54) CHIP WITH I/O PADS ON PERIPHERIES AND METHOD MAKING THE SAME

(71) Applicant: SunASIC Technologies, Inc., New Taipei (TW)

(72) Inventors: Chi Chou Lin, Taipei (TW); Zheng Ping He, Taipei (TW)

(73) Assignee: Sunasic Technologies, Inc., New Taipei (TW)

( * ) Notice: Subject to any disclaimer, the term of this patent is extended or adjusted under 35 U.S.C. 154(b) by 0 days.

(21) Appl. No.: 15/460,482

(22) Filed: Mar. 16, 2017

(65) Prior Publication Data

US 2017/0186716 A1    Jun. 29, 2017

Related U.S. Application Data (63) Continuation of application No. 14/755,492, filed on Jun. 30, 2015, now Pat. No. 9,633,960.

(51) Int. Cl.

| | |
|---|---|
| *H01L 23/48* | (2006.01) |
| *H01L 23/00* | (2006.01) |
| *H01L 21/78* | (2006.01) |
| *H01L 23/544* | (2006.01) |
| *G06K 9/00* | (2006.01) |

(52) U.S. Cl.
CPC .......... *H01L 24/06* (2013.01); *G06K 9/00013* (2013.01); *H01L 21/78* (2013.01); *H01L 23/544* (2013.01); *H01L 24/03* (2013.01); *H01L 24/05* (2013.01); *H01L 2223/5446* (2013.01); *H01L 2224/03614* (2013.01); *H01L 2224/05026* (2013.01); *H01L 2224/06135* (2013.01)

(58) Field of Classification Search
CPC . H01L 24/03; H01L 24/06; H01L 2223/5446; H01L 21/78; H01L 21/7685
USPC .................................. 257/773, 786; 438/666
See application file for complete search history.

(56) References Cited

U.S. PATENT DOCUMENTS

| | | | | |
|---|---|---|---|---|
| 2009/0121337 A1* | 5/2009 | Abe | .................... | B23K 26/0057 257/686 |
| 2012/0032225 A1* | 2/2012 | Hamaguchi | ............. | H01L 33/44 257/99 |
| 2015/0228557 A1* | 8/2015 | Cheng | ................. | H01L 23/3114 257/622 |
| 2015/0311188 A1* | 10/2015 | Mao | ........................ | H01L 25/50 438/15 |

* cited by examiner

*Primary Examiner* — Nitin Parekh
(74) *Attorney, Agent, or Firm* — Che-Yang Chen; Law Offices of Scott Warmuth (57) ABSTRACT

A chip with I/O pads on the peripheries and a method making the chip is disclosed. The chip includes: a substrate; a first metal layer, formed above the substrate; an inter-metal dielectric layer, formed above the first metal layer, having concave portions formed along the peripheries of the chip so that a portion of the first metal layer is exposed to form an input-output (I/O) pad in each of the concave portions which are spaced apart from each other; and a passivation layer, formed above the second metal layer without covering the concave portions so that specific circuits are formed by the first metal layer and the second metal layer, respectively. By changing the I/O pad from the top of the chip to the peripheries, the extra thickness of the packaged chip caused by wire bonding in the prior arts can be reduced.

11 Claims, 12 Drawing Sheets

CHIP WITH I/O PADS ON PERIPHERIES AND METHOD MAKING THE SAME

FIELD OF THE INVENTION

The present invention relates to a chip with I/O pads and a method to manufacture it. More particularly, the present invention relates to a chip with I/O pads on the peripheries of the chip and a method to manufacture it.

BACKGROUND OF THE INVENTION

With the development of Integrated Circuit (IC) manufacturing processes, new packaging methods have been invented and applied to a variety of IC products. For example, Fine-Pitch Ball Grid Array (FPBGA) technology is used for most logic ICs while Thin Small Outline Package (TSOP) remains the main stream of memory packages. To choose a proper packaging type for a IC product, a designer should take the application into consideration, i.e. numbers of I/O signals, frequency, operation temperature, space, cost, etc.

Figure 1:
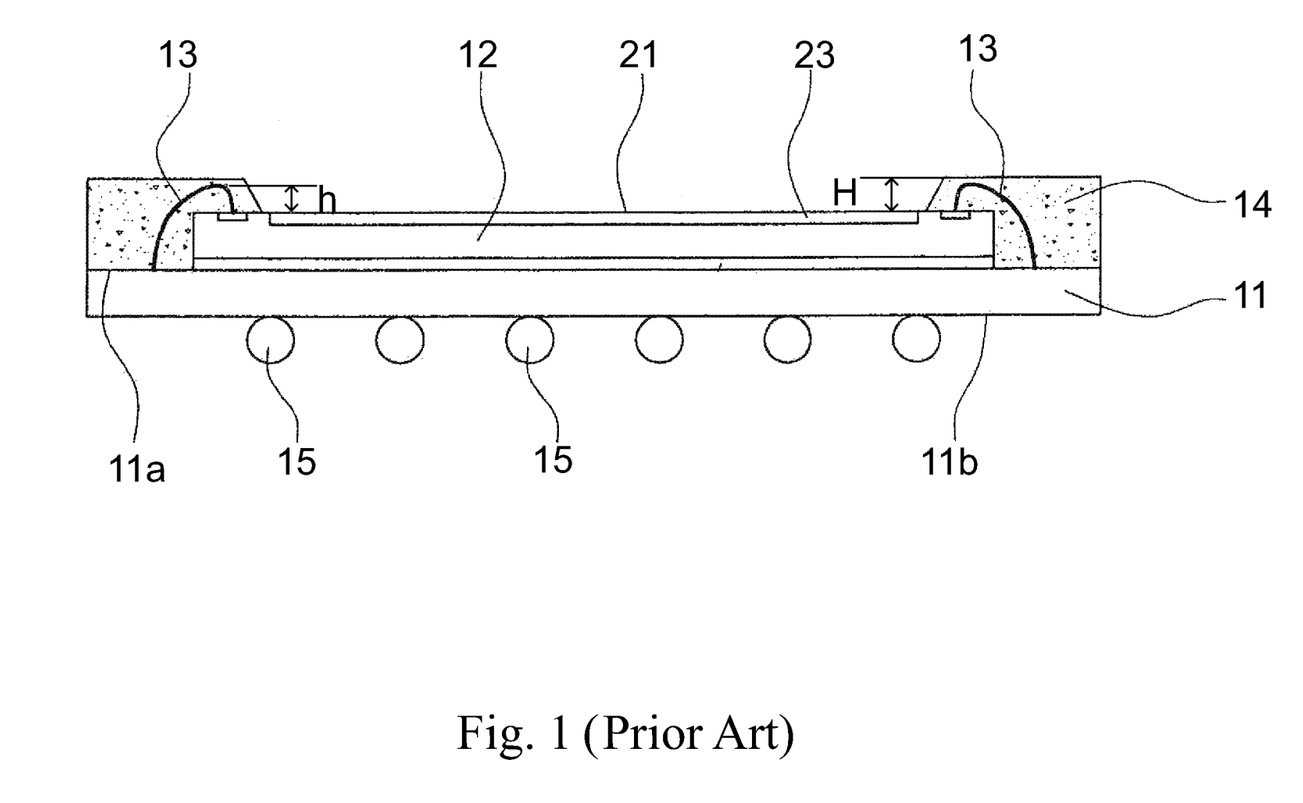
FIG. 1 shows a cross-sectional structure of a fingerprint sensor package using wire bounding method.

However, popular packaging methods may not apply to special cases that may require particular geometry or physical requirement. For instance, a photo sensor or a capacitive fingerprint sensor IC needs to have the sensing area exposed for picking up light or electrical energy. Therefore, a commonly used packaging type would have a sealing material over only the non-sensing area, including the wire-bonded pads, and leave the sensing area exposed to the environment as shown in FIG. 1. FIG. 1 shows a cross-sectional structure of a fingerprint sensor package. The fingerprint sensor package mainly includes a substrate 11, a fingerprint sensing chip 12, a number of bonding wires 13 and a sealing material 14. An active surface 21 of the fingerprint sensing chip 12 has a sensing region 23 formed thereon. The back of the fingerprint sensing chip 12 is adhered to a top surface 11a of the substrate 11. The fingerprint sensing chip 12 is electrically connected to the substrate 11 with the bonding wires 13. The sealing material 14 is formed on the top surface 11a of the substrate 11 to seal the bonding wires 13 and the non-sensing portion of the fingerprint sensing chip 12. The sensing region 23 must be exposed. There are several bumps 15 formed on a bottom surface 11b of the substrate 11 as signal connectors to receive power and to electrically communicate with external circuitry.

It is clear from FIG. 1 that a protrusion height H of sealing material 14, including a height h of bonding wires 13 and that of bonding material for covering the wires, cannot be avoided. When portable devices, such as a smart phone or smart card, which carry the fingerprint sensing chip 12 become more compact and slim than ever, the protrusion height H is preferred to be eliminated so that the surface of portable devices can be perfectly flat.

Figure 2:
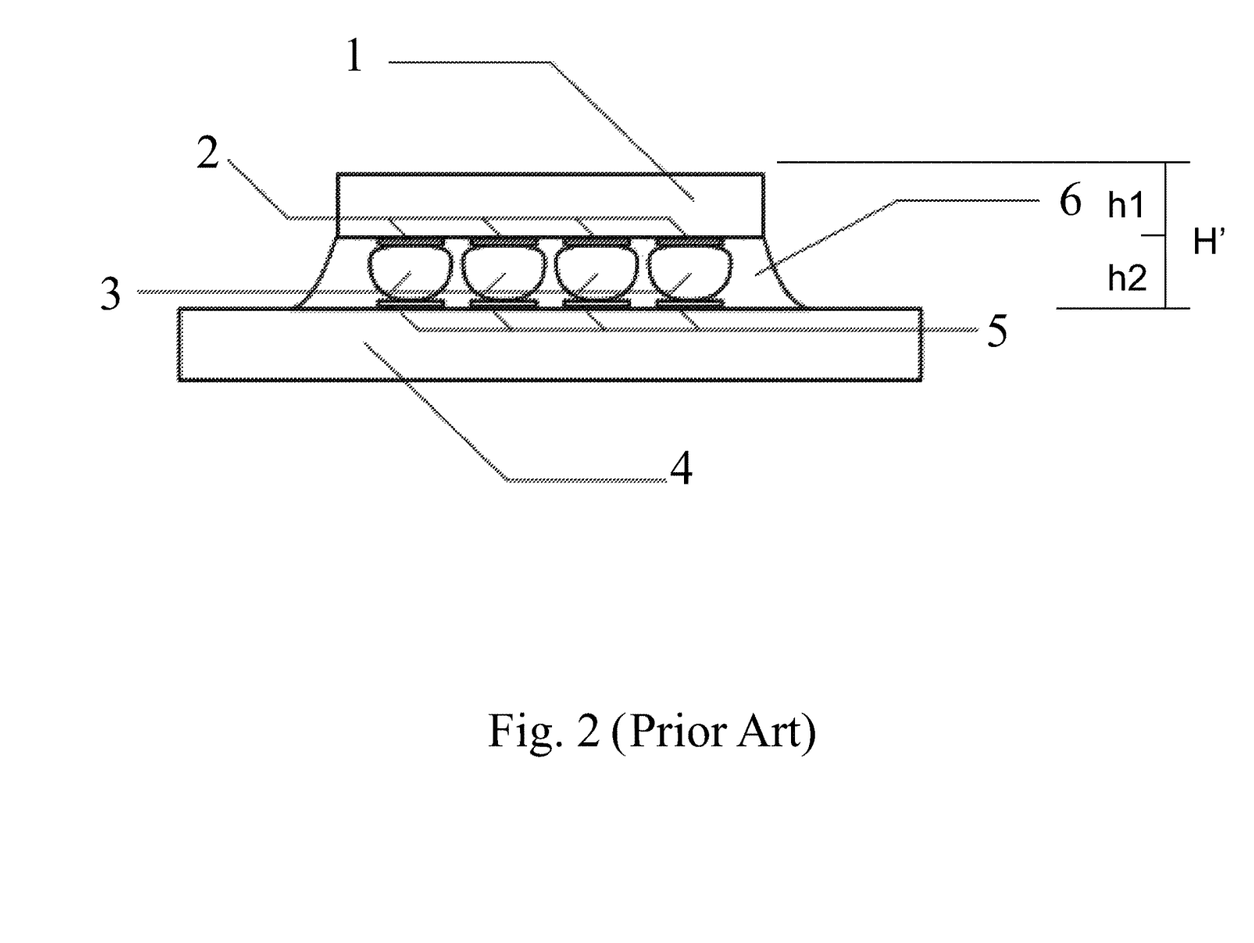
FIG. 2 shows a cross-sectional structure of a flip chip package.

Flip Chip assembly is another popular packaging method whose package size is smaller than a traditional carrier-based package. However, for a contact image sensor or a capacitive fingerprint sensor IC which may require both a compact package and a flat contact surface, flip chip assembly may not suitable. A typical flip chip assembly is shown in FIG. 2. Attachment pads 2 of a chip 1 and contact pads 5 on a PCB 4 are electrically connected using solder balls 3, and an electrically-insulating adhesive 6 is then underfilled to provide a stronger mechanical connection. A surface level difference H' between the upper surface of the chip 1 and the upper surface of the PCB 4, which is the sum of the height of the chip h1 and that of the solder balls h2, makes a flat top surface of the package impossible.

Besides the technologies mentioned above, another technology involves chip-scale packaging is disclosed by U.S. Pat. No. 8,736,080. U.S. Pat. No. 8,736,080 of ARNOLD et al. discloses a compact Integrated Circuit Assembly comprising: an integrated circuit, a substrate where the integrated circuit is disposed on, a conductive layer disposed in the signal trench and coupling to the integrated circuit signal pad, a bond wire configured to couple the conductive layer to an external pad. The substrate comprise at least one signal trench which proximate to an integrated circuit signal pad and extending to one edge of the substrate. The bond wire, the at least one signal trench and the conductive layer are formed below a surface plane of the integrated circuit. This method successfully reduces the height of the package, and also provides a flat top surface. However, the manufacture process, involving a deep etching step to form the trench and an additional metal plating step to form the conductive layer, requires more manufacture time and additional cost.

Therefore, in order to solve the problem mentioned above, a chip with pads on the peripheries and a method to manufacture the chip is provided. The chip can be a fingerprint sensing chip, even a contact image sensor.

SUMMARY OF THE INVENTION

This paragraph extracts and compiles some features of the present invention; other features will be disclosed in the follow-up paragraphs. It is intended to cover various modifications and similar arrangements included within the spirit and scope of the appended claims.

In order to settle the problems mentioned above, a chip with I/O pads on the peripheries is disclosed. The chip includes: a substrate; at least two metal layers formed above the substrate, each metal layer forming a specific circuit, wherein two adjacent metal layers are separated by an inter-metal dielectric layer; and a passivation layer, formed on a top side of the chip, a plurality of I/O pads are formed in at least one metal layer and on peripheries of the chip; a pad window is formed above the I/O pad or part of the I/O pad; a connecting space is formed at the pad window; a contact surface of the I/O pad is exposed through the pad window; a distance between the contact surface of the I/O pad and an external surface of the passivation layer is larger than a connecting depth.

Preferably, the connecting depth is 3 μm or more. A side of the pad window extends to a saw street of a wafer where the chip is made before the chip was diced from the wafer. The chip is a fingerprint sensing IC (Integrated Circuit) and a sensing area is formed on a portion of the top side.

According to another aspect of the present invention, a method to make a chip with I/O pads on the peripheries is disclosed. The method includes the steps of: providing a substrate; forming a lower metal layer above the substrate, which contains a specific circuit and a plurality of I/O pads; forming an inter-metal dielectric layer above the lower metal layer and a plurality of via openings therein; forming other metal layers, inter-metal dielectric layers and vias formed therein if needed; forming an upper metal layer above the last formed inter-metal dielectric layer, which contains a specific circuit; forming a passivation layer above the upper metal layer; deeply etching a plurality of pad windows to expose the I/O pads; and dicing the wafer along the saw streets of the wafer formed therein. Each metal layer forms a specific circuit. The I/O pads are formed on peripheries of the chip. A pad window is formed above the I/O pad or part of the I/O pad. A connecting space is formed at the pad window. A contact surface of the I/O pad is exposed through the pad window. A distance between a contact surface of the I/O pad and an external surface of the passivation layer is larger than a connecting depth.

According to the present invention, another method to make a chip with I/O pads on the peripheries is disclosed. The method includes the steps of: providing a substrate; forming a lower metal layer above the substrate, which contains a specific circuit and a lower layer of each I/O pad; forming an inter-metal dielectric layer above the lower metal layer and a plurality of via openings therein; forming other metal layers, inter-metal dielectric layers and vias formed therein if needed; deeply etching a plurality of vias at the I/O pad locations; forming an upper metal layer above the last formed inter-metal dielectric layer, which contains a specific circuit; forming a passivation layer above the upper metal layer; etching a plurality of pad windows to expose the I/O pads; and dicing the wafer along the saw streets of the wafer formed therein. Each metal layer forms a specific circuit. The I/O pads are formed on peripheries of the chip. A pad window is formed above the I/O pad or part of the I/O pad. A connecting space is formed at the pad window. A contact surface of the I/O pad is exposed through the pad window. A distance between a contact surface of the I/O pad and an external surface of the passivation layer is larger than a connecting depth. The via at each I/O pad location forms a concave portion, and a portion of the upper metal layer formed at each pad location forms a stacked metal structure. The stacked metal structure electrically links the upper metal layer to the lower metal layer. The contact surface of the I/O pad is a top surface of the upper metal layer at the I/O pad location.

By changing the I/O pad from the top of the chip to the peripheries of the chip and applying the conductive adhesive to electrically connect with external circuitry, the extra thickness of the packaged chip caused by wire bonding can be removed. And, a low-cost sensor chip assembly with a flat top surface can be achieved. It is a good solution for the problems mentioned above.

DETAILED DESCRIPTION OF THE PREFERRED EMBODIMENTS

The present invention will now be described more specifically with reference to the following embodiments.

Figure 3:
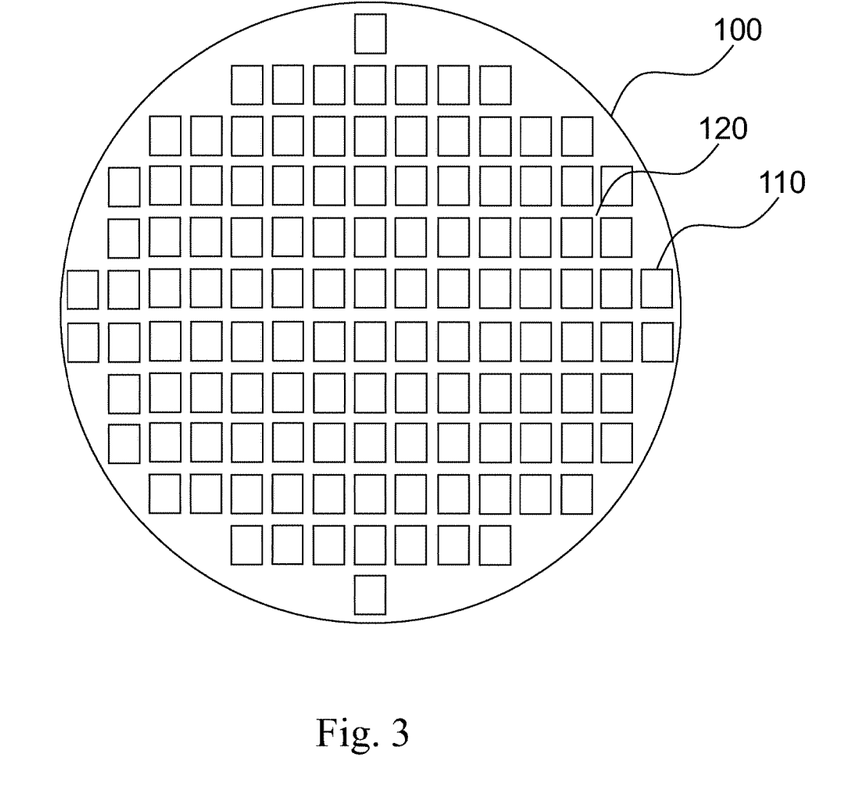
FIG. 3 depicts a wafer with fingerprint sensing chips and saw streets formed thereon.

Please see FIG. 3 to FIG. 12. Embodiments according to the present invention are described with reference thereto. FIG. 3 depicts a wafer 100 and a number of fingerprint sensing chips 110 formed thereon. A saw street 120 is formed between two rows or columns of fingerprint sensing chips 110. The saw street 120 is used to be cut out so that each fingerprint sensing chip 110 can be taken out.

Figure 4:
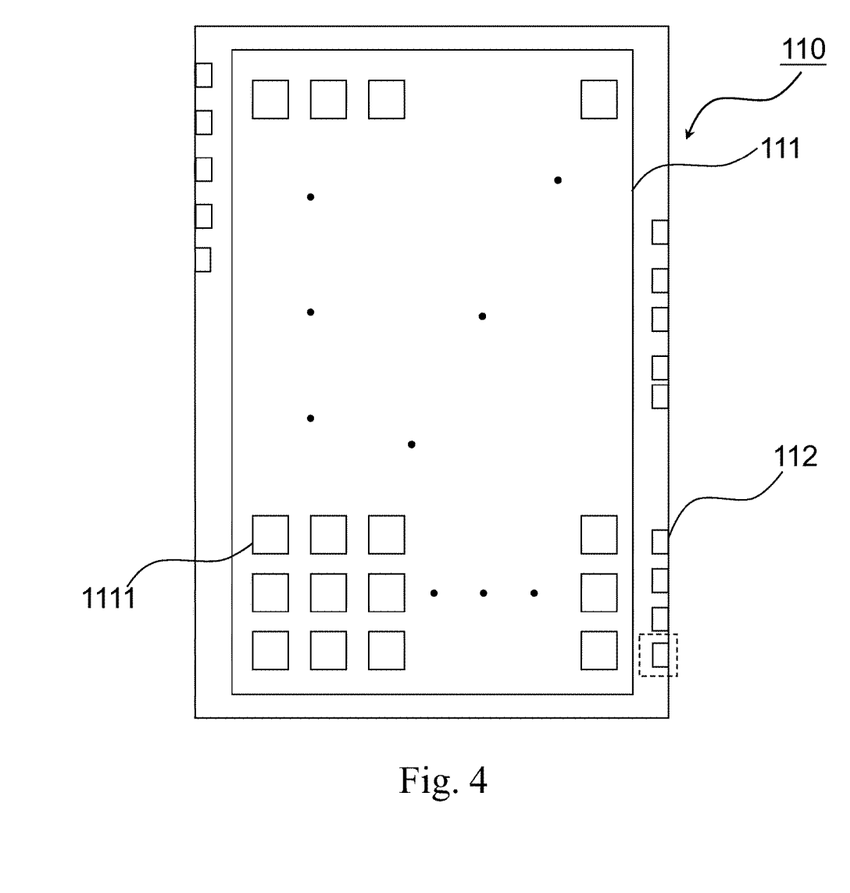
FIG. 4 is a top view of one fingerprint sensing chip.
Figure 5:
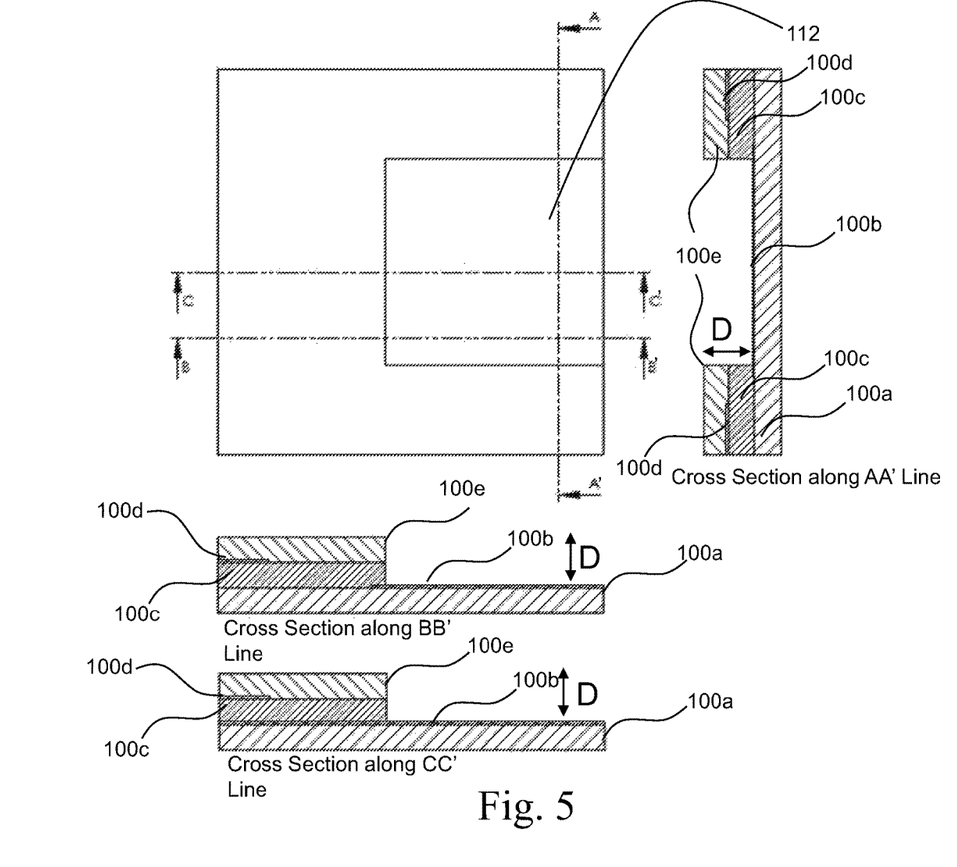
FIG. 5 shows three cross sections of the I/O pad.

A top view of one fingerprint sensing chip 110 is shown in FIG. 4. The fingerprint sensing chip 110 has a sensing area 111. The sensing area 111 is composed of an array of sensing units 1111. Around the sensing area 111, in peripheries of the fingerprint sensing chip 110, there are a number of I/O pads 112. Not like conventional fingerprint sensing chips, the I/O pads 112 are just formed at and aligned with the peripheries of the fingerprint sensing chip 110 according to the present invention. The I/O pads 112 are also located below the top surface of the fingerprint sensing chip 110 instead of being on the top surface of the fingerprint sensing chip 110. For a better understanding of the structure of the I/O pads 112, please refer to FIG. 5. FIG. 5 shows three cross sections of the I/O pad 112 enclosed by a dashed frame on the right bottom of the fingerprint sensing chip 110 in FIG. 4.

Figure 6:
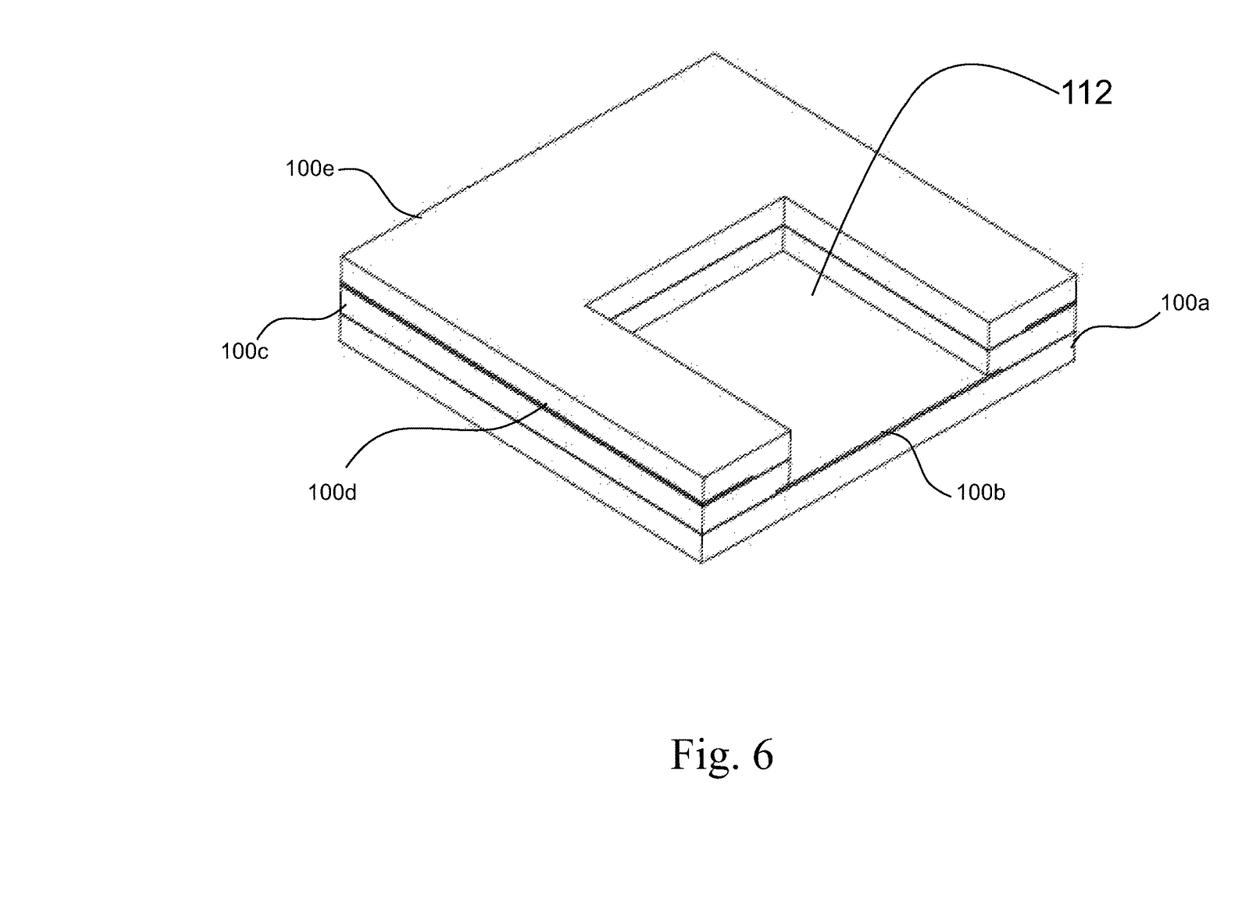
FIG. 6 is a three dimensional view of the fingerprint sensing chip in a first embodiment.
Figure 7:
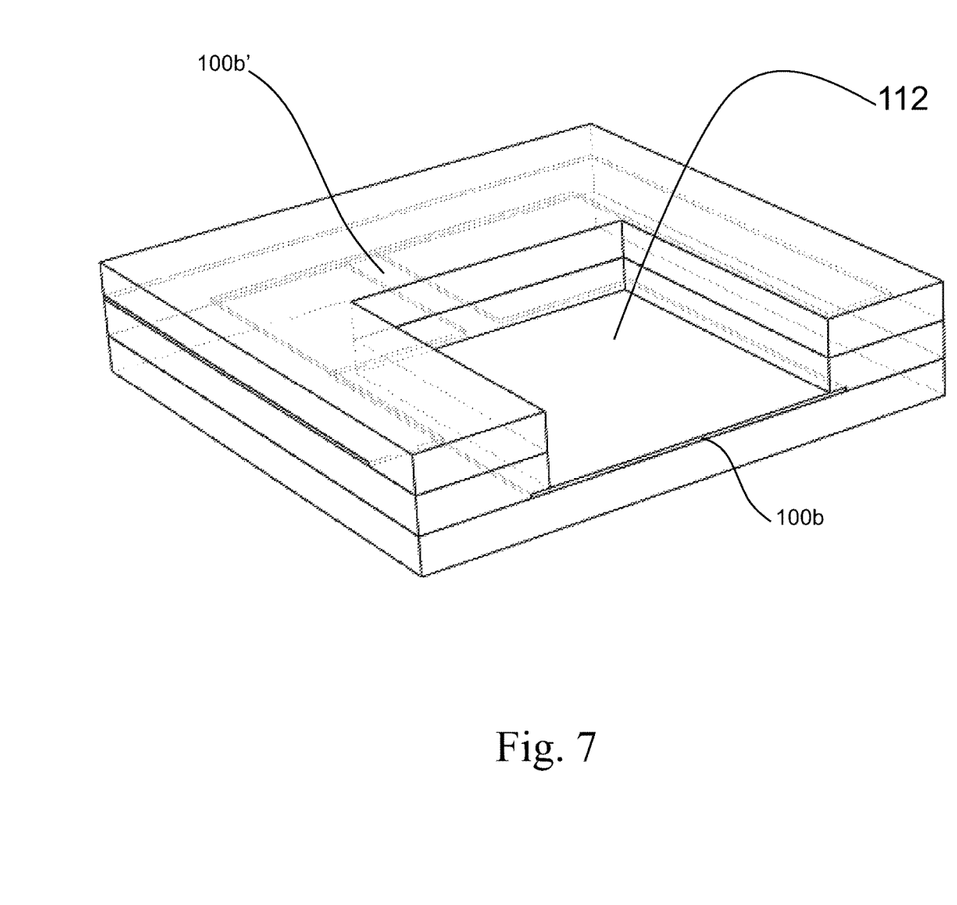
FIG. 7 is a perspective view of the I/O pad.

In FIG. 5, the three cross sections are obtained along an AA' line, a BB' line and a CC' line, respectively. A three dimensional view around the I/O pad 112 of the fingerprint sensing chip 110 is shown in FIG. 6. It is obvious that the pad structure of the fingerprint sensing chip 110 comprises a substrate 100a, a lower metal layer 100b, an inter-metal dielectric layer 100c, an upper metal layer 100d and a passivation layer 100e. The passivation layer 100e is on the top side of the fingerprint sensing chip 110. It should be noticed that one fingerprint sensing chip may have metal layers more than two layers around the I/O pads. The number of inter-metal dielectric layer will be increased accordingly (two adjacent metal layers are separated by one inter-metal dielectric layer). The structure of the fingerprint sensing chip 110 illustrated in the present embodiment is just for illustrative purpose. It is not to limit the applications of the present invention. According to the spirit of the present invention, there should be at least two metal layers. Each metal layer (the lower metal layer 100b or the upper metal layer 100d) forms a specific circuit. The lower metal layer 100b and the upper metal layer 100d may be interlinked in other portions of the fingerprint sensing chip 110 for signal transmission.

In FIG. 5 and FIG. 6, the two metal layers are not linked. It is clear from the cross sections along that AA' line and the CC' line that a portion of the lower metal layer 100b forms the I/O pad 112. Please see FIG. 7. It is a perspective view of the I/O pad 112 enclosed in FIG. 4. The lower metal layer 100b has a number of traces 100b'. Each I/O pad 112 is just linked to one trace 100b' and formed on peripheries of the fingerprint sensing chip 110. A connecting space is formed above each I/O pad 112 at the pad window. Therefore, a portion of materials of the fingerprint sensing chip 110 above the I/O pad 112 are removed by etching a pad window above the I/O pad 112 or part of the I/O pad 112. Namely, portions of the inter-metal dielectric layer 100c and the passivation layer 100e above the I/O pad 112 are removed. Thus, a distance D between a contact surface of the I/O pad 112 and an external surface of the passivation layer 100e (the topmost portion of the passivation layer 100e) exists. The distance D should be larger than a connecting depth. In practice, the connecting depth should be 3 µm or more.

Figure 8:
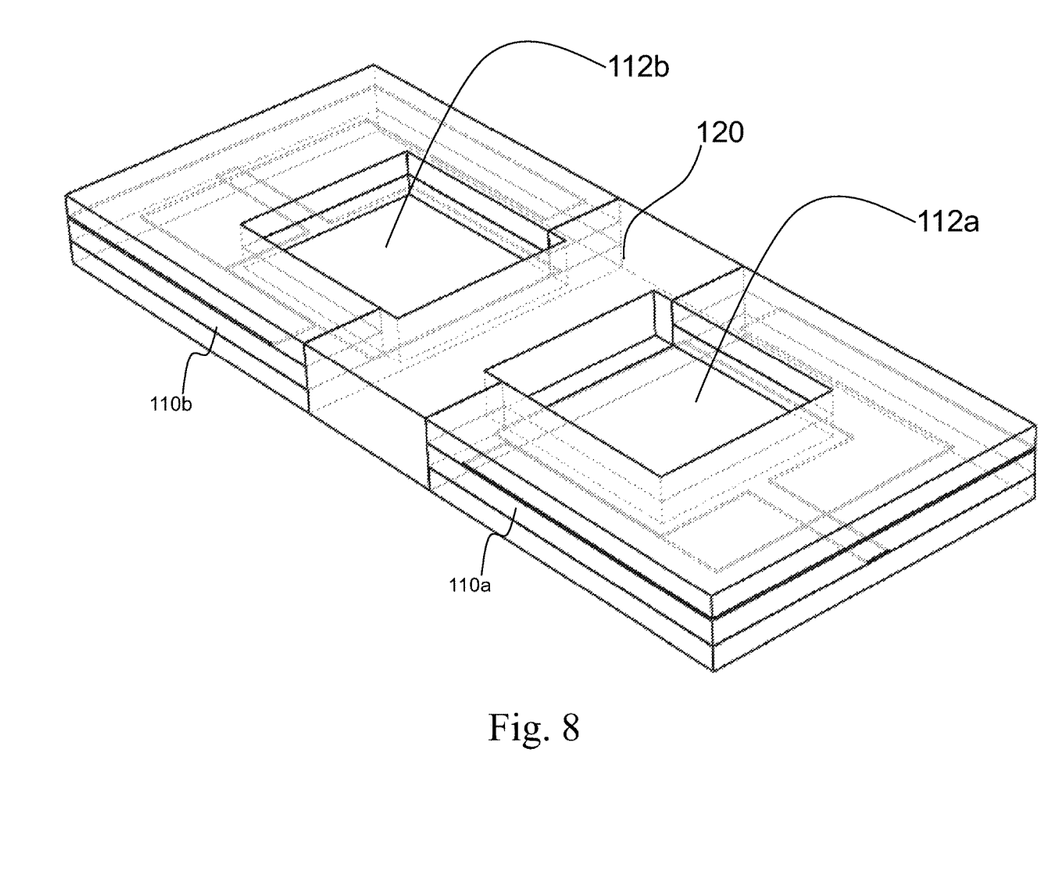
FIG. 8 shows two I/O pads in adjacent fingerprint sensing chips cut along with the saw street.
Figure 9:
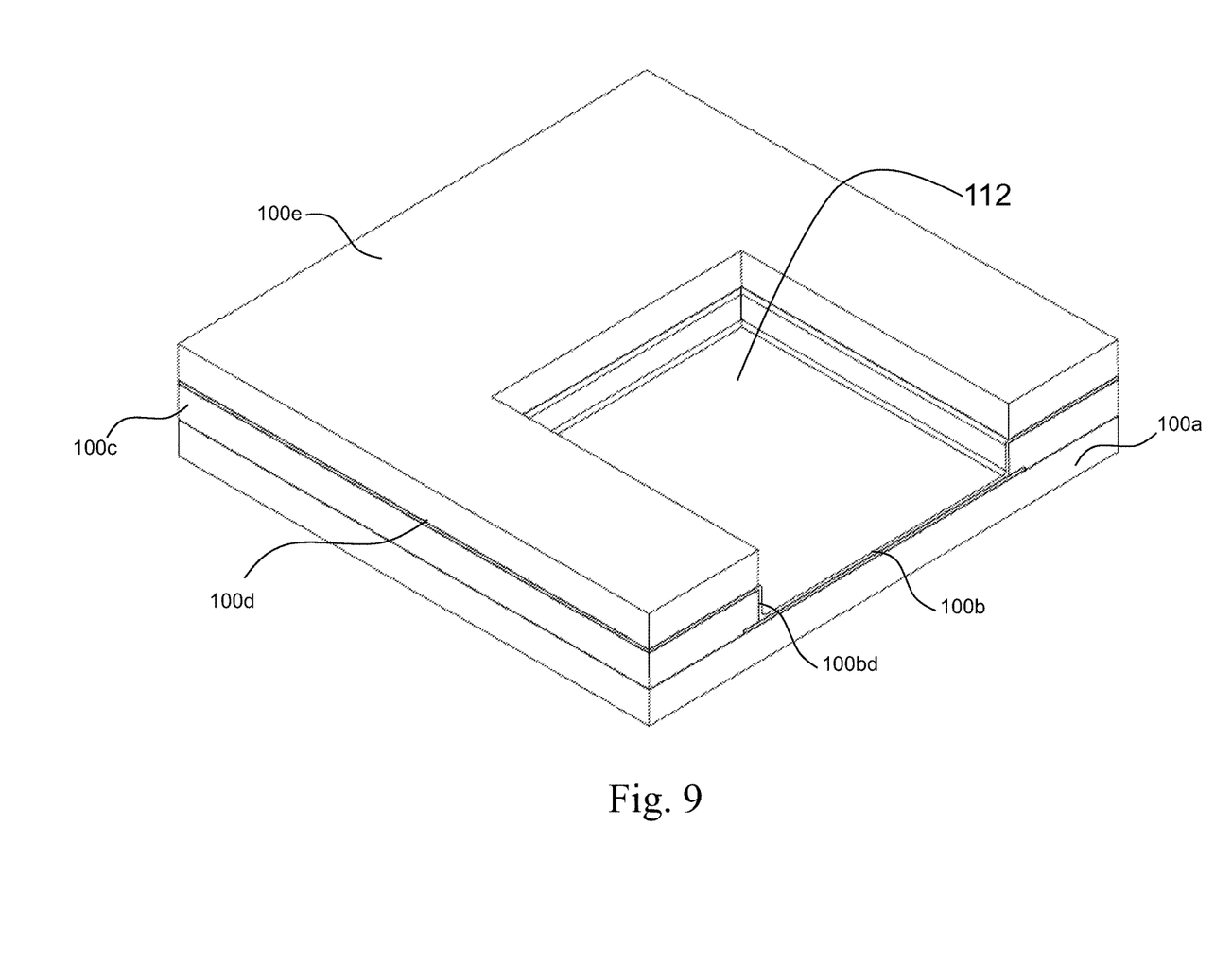
FIG. 9 is a three dimensional view of the fingerprint sensing chip in a second embodiment.

Please refer to FIG. 8. FIG. 8 shows a three dimensional view of two I/O pads 112a and 112b in two adjacent fingerprint sensing chips 110a and 110b, respectively, and a saw street 120 thereinbetween. In order to form the I/O pads 112 that are exactly located at and aligned with the periphery of the fingerprint sensing chip 110, according to the present invention, a side of the pad window should extend to the saw street 120 of the wafer 100 where the fingerprint sensing chip 110 is made before the it was diced from the wafer 100.

It is obvious that the I/O pad 112 forms a platform in the connecting space. Thus, the I/O pad 112 can allow a conductive adhesive to be applied thereon and filled fully or partially in the connecting space. The conductive adhesive can electrically connect the I/O pad 112 to a contact pad of an external circuit (not shown). Preferably, the conductive adhesive may be a silver paste. Also, the connection between the I/O pad 112 and the contact pad of external circuit may be achieved by a solder paste or metal plating. It is an innovative change of I/O pad design of a chip. If the electrical linkage method of wire bonding can be replaced by the conductive adhesive, the electrical linkages are all formed below the topmost surface of the chip. Thus, the thickness of the packaged chip can be reduced.

In a second embodiment, the lower metal layer 100*b* and the upper metal layer 100*d* can be linked at the I/O pad 112. Please see FIG. 9. The linkage is achieved by a stacked metal structure 100*bd*, which is formed along with the upper metal layer, at the via opening above the I/O pad 112.

Figure 10:
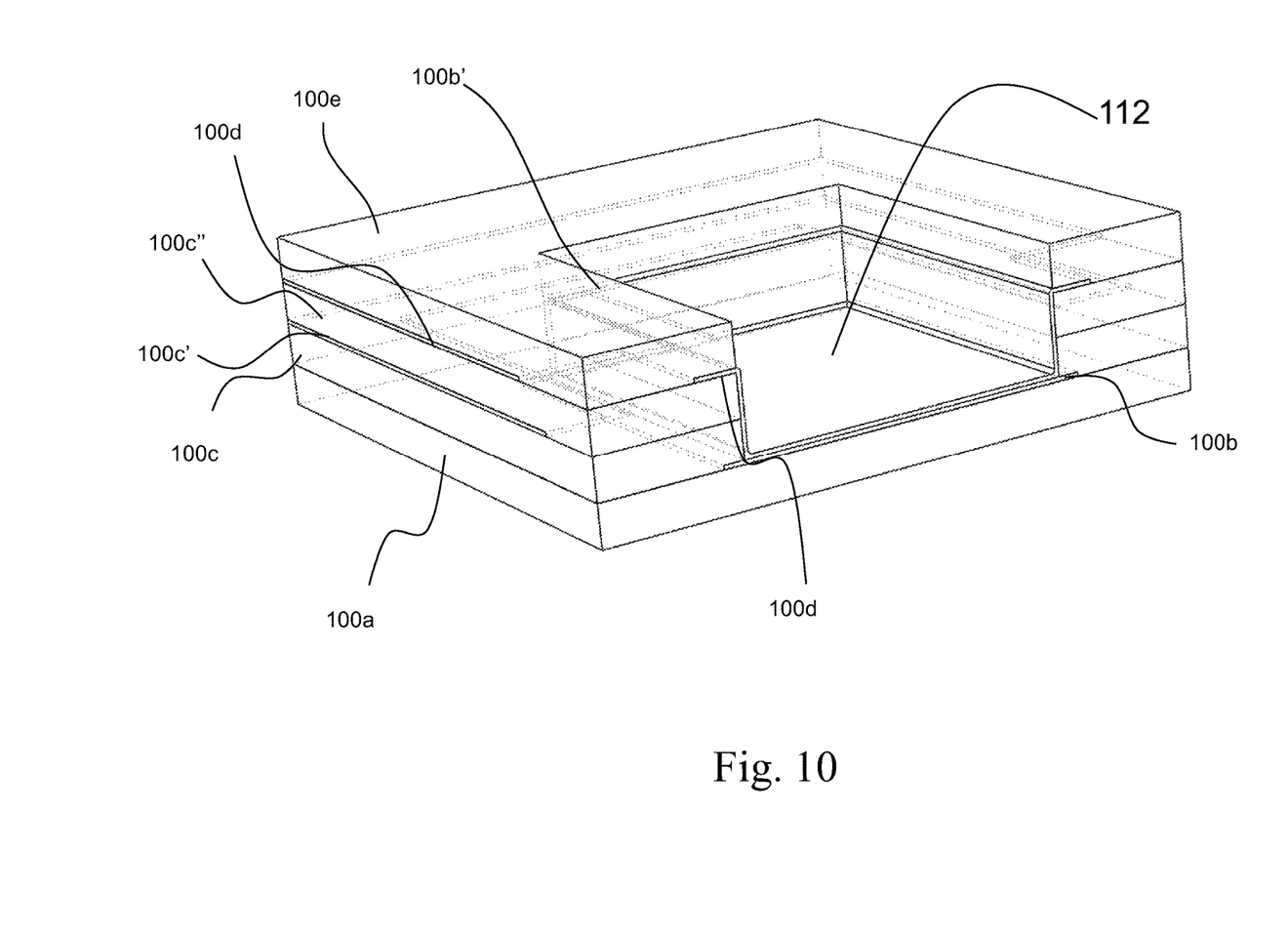
FIG. 10 is a three dimensional view of the fingerprint sensing chip in a third embodiment.

In a third embodiment, the fingerprint sensing chip 110 may have three metal layers around some I/O pads 112 and is shown in FIG. 10. FIG. 10 is a perspective view of the I/O pad 112. An additional metal layer 100*c'* and an additional inter-metal dielectric layer 100*c"* are formed between the inter-metal dielectric layer 100*c* and the upper metal layer 100*d*.

In a fourth embodiment, the connecting space is not requested to only form above the full I/O pad 112. It can be formed on part of the I/O pad 112. It means a portion of the I/O pad 112 may be buried below the inter-metal dielectric layer 100*c*. In another case, the connecting space can also extend beyond the I/O pad 112, which means the connecting space is slightly larger than the I/O pad 112 in a top view. In practice, due to variation of physical condition for manufacturing the fingerprint sensing chip 110, portions of the I/O pad 112 are really embedded between the substrate 100*a* and the inter-metal dielectric layer 100*c*.

Figure 11:
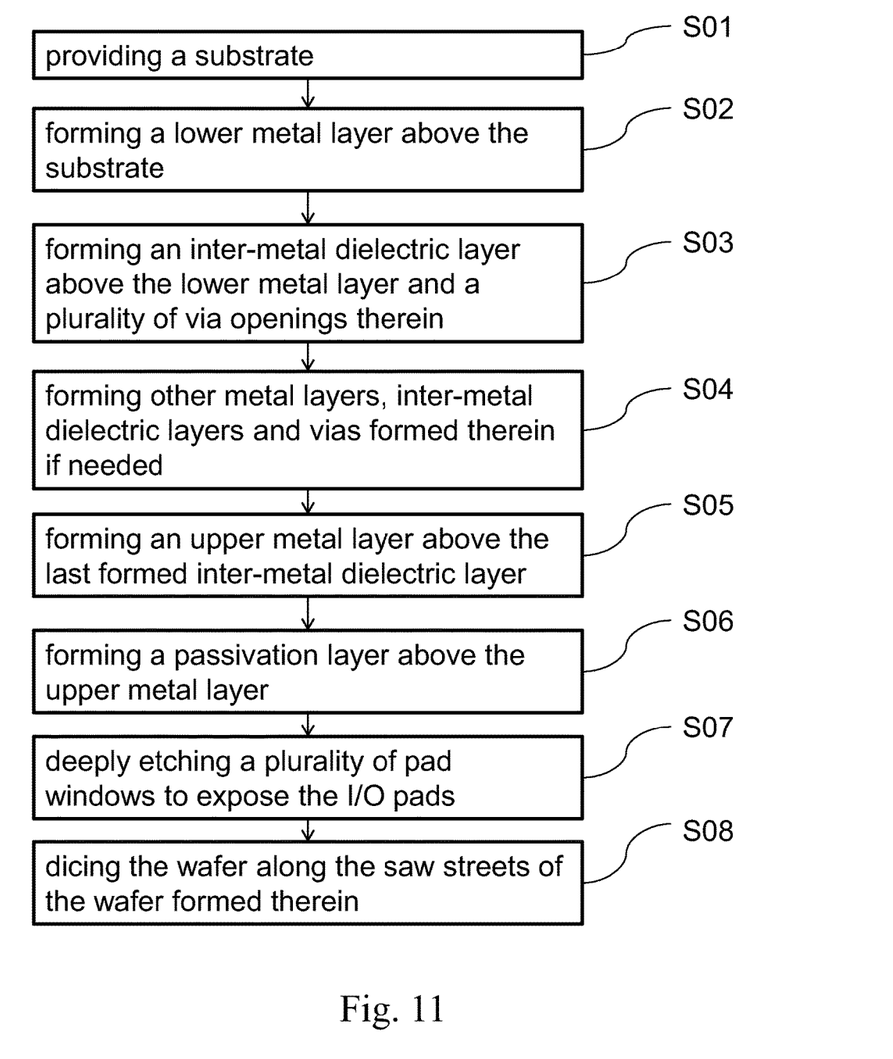
FIG. 11 is a flow chart of a method to making a chip of the first embodiment according to the present invention.

For the description above, a method to make a chip with I/O pads on the peripheries can be obtained. Please refer to FIG. 11. FIG. 11 is a flow chart of the method. The method has below steps. First, provide a substrate (S01). Second, form a lower metal layer above the substrate, which contains a specific circuit and a number of I/O pads (S02). Third, form an inter-metal dielectric layer above the lower metal layer and a number of via openings therein (S03). Fourth, form other metal layers, inter-metal dielectric layers and vias formed therein if needed (S04). Fifth, form an upper metal layer above the last formed inter-metal dielectric layer, which contains a specific circuit (S05). Then, form a passivation layer above the upper metal layer (S06). Next, deeply etch a number of pad windows to expose the I/O pads (S07). Finally, dice the wafer along the saw streets of the wafer formed therein (S08). It should be noticed that two adjacent metal layers are separated by an inter-metal dielectric layer. Meanwhile, at least one metal layer should have a number of traces. An I/O pad linked to one or more trace(s) is formed and a portion of the layer(s) above the I/O pad is removed. According to the present invention, each metal layer forming a specific circuit. The I/O pads are formed on peripheries of the chip. A pad window is formed above the I/O pad or part of the I/O pad. A connecting space is formed at the pad window. A contact surface of the I/O pad is exposed through the pad window. A distance between the contact surface of the I/O pad and an external surface of the passivation layer is larger than a connecting depth. The definition of the connecting depth is as that in the previous embodiment and not repeat here.

Figure 12:
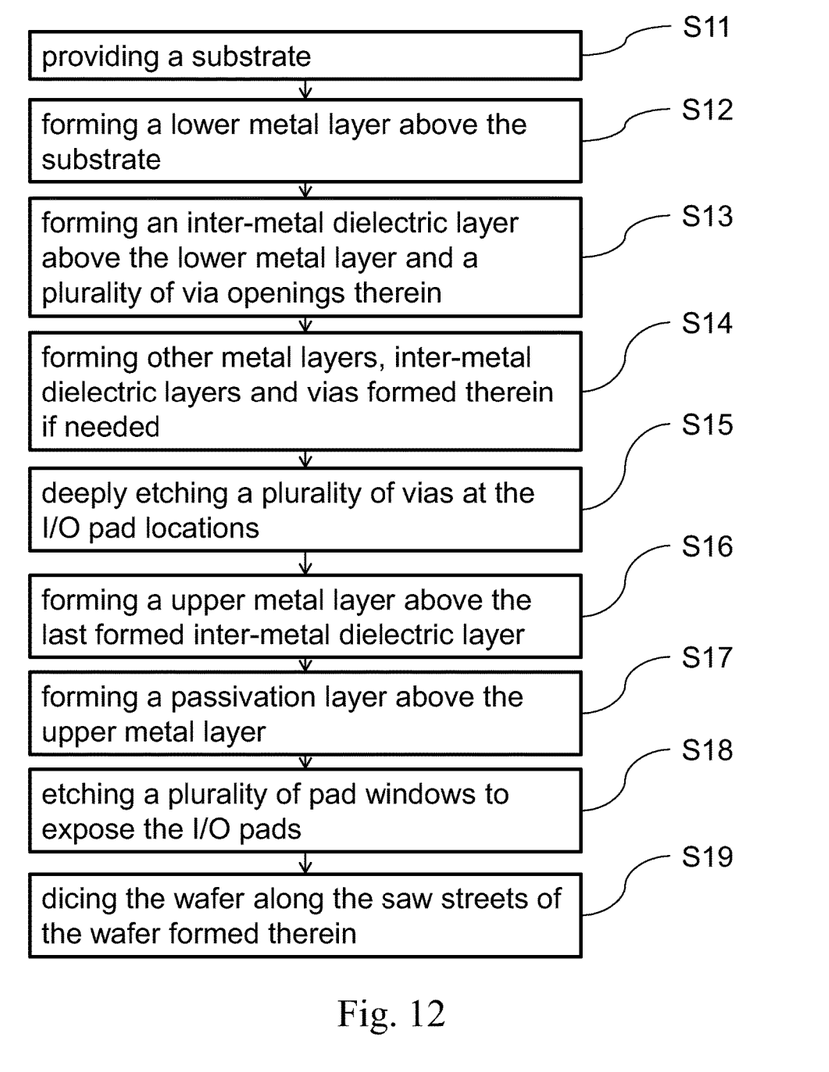
FIG. 12 is a flow chart of a method to making a chip of the second embodiment according to the present invention.

Another method to make a chip with I/O pads on the peripheries can also be available. Steps of the method are shown in FIG. 12. It is slightly different from the previous method. The current method has below steps. First, provide a substrate (S11). Second, form a lower metal layer above the substrate, which contains a specific circuit and a lower layer of each I/O pad (S12). Third, form an inter-metal dielectric layer above the lower metal layer and a plurality of via openings therein (S13). Fourth, form other metal layers, inter-metal dielectric layers and vias formed therein if needed (S14). Fifth, deeply etch a number of vias at the I/O pad locations (S15). Sixth, form an upper metal layer above the last formed inter-metal dielectric layer, which contains a specific circuit (S16). Then, form a passivation layer above the upper metal layer (S17). Next, etch a number of pad windows to expose the I/O pads (S18). Finally, dice the wafer along the saw streets of the wafer formed therein (S19). It should be noticed that two adjacent metal layers are separated by an inter-metal dielectric layer. Meanwhile, at least one metal layer should have a number of traces. An I/O pad linked to one or more trace(s) is formed and a portion of the layer(s) above the I/O pad is removed. According to the present invention, each metal layer forming a specific circuit. The I/O pads are formed on peripheries of the chip. A pad window is formed above the I/O pad or part of the I/O pad. A connecting space is formed at the pad window. A contact surface of the I/O pad is exposed through the pad window. A distance between the contact surface of the I/O pad and an external surface of the passivation layer is larger than a connecting depth. The definition of the connecting depth is as that in the previous embodiment and not repeat here. The via at each I/O pad location forms a concave portion, and a portion of the upper metal layer formed at each pad location forms a stacked metal structure. The stacked metal structure electrically links the upper metal layer to the lower metal layer. The contact surface of the I/O pad is a top surface of the upper metal layer at the I/O pad location.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A chip with I/O pads on the peripheries, comprising:
   a substrate;
   a first metal layer, formed above the substrate;
   an inter-metal dielectric layer, formed above the first metal layer, having a plurality of concave portions formed along the peripheries of the chip so that a portion of the first metal layer is exposed to form an input-output (I/O) pad in each of the plurality of concave portions, wherein the plurality of concave portions are spaced apart from each other, and the I/O pads have a top surface lower than a top surface of the inter-metal dielectric layer;

a second metal layer, formed above the inter-metal dielectric layer; and a passivation layer, formed above the second metal layer without covering the plurality of concave portions, wherein the first metal layer and the second metal layer each contains a specific circuit;

wherein the inter-metal dielectric layer and the passivation layer together forms walls of the plurality of concave portions while leaving an opening along the peripheries of the chip in each of the plurality of concave portions; and wherein the I/O pads forms a bottom surface of the plurality of concave portions.

2. The chip according to claim 1, wherein the chip is a fingerprint sensing IC (Integrated Circuit) and a sensing area is formed on a portion of the top side.

3. The chip according to claim 1, wherein the chip is connected to a contact pad of an external circuit by adding a conductive element into the plurality of concave portions.

4. The chip according to claim 3, wherein the conductive element is a conductive adhesive, a bonding wire, a solder ball or a metallic deposition.

5. The chip according to claim 1, wherein a distance between an exposed surface of the I/O pad and an external surface of the passivation layer is larger than or equal to 3 µm.

6. A method for manufacturing a chip with I/O pads on the peripheries according to claim 1, comprising the steps of:

providing a wafer substrate having a plurality of saw streets;

forming a first metal layer which contains a specific circuit above the wafer substrate;

forming an inter-metal dielectric layer above the first metal layer;

forming a second metal layer which contains a specific circuit above a portion of the inter-metal dielectric layer;

forming a passivation layer above the second metal layer;

etching through the passivation layer and the inter-metal dielectric layer which is not covered by the second metal layer to form a plurality of via openings over a portion of the chip and the saw streets so that a portion of the first metal layer is exposed and a portion of the plurality of saw streets are etched away; and dicing along the saw streets;

wherein a plurality of concave portions are formed along the peripheries of the chip after the dicing step; and wherein the plurality of concave portions are spaced apart from each other.

7. The method according to claim 6, further comprising between the inter-metal dielectric layer formation step and the second metal layer formation step, a step of:

etching through the inter-metal dielectric layer to form a plurality of via openings over the chip and the saw streets so that a portion of the first metal layer is exposed and a portion of the plurality of saw streets are etched away.

8. The method according to claim 7, wherein the second metal layer extends along the plurality of via openings and covers the exposed portion of the first metal layer, and together with the first metal layer form the plurality of I/O pads.

9. The method according to claim 6, further comprising between the inter-metal dielectric layer formation step and the second metal layer formation step, a step of:

forming other metal layers and inter-metal dielectric layers.

10. The method according to claim 6, further comprising between the inter-metal dielectric layer formation step and the second metal layer formation step, steps of:

forming other metal layers and inter-metal dielectric layers; and etching through the respective inter-metal dielectric layer to form a plurality of via openings over the chip and the saw streets so that a portion of the first metal layer is exposed and a portion of the plurality of saw streets are etched away.

11. The method according to claim 10, wherein the second metal layer extends along the plurality of via openings and covers the exposed portion of the first metal layer, and together with the first metal layer form the plurality of I/O pads.

* * * * *